(12) United States Patent
Hoffman et al.

(10) Patent No.: US 7,573,713 B2
(45) Date of Patent: Aug. 11, 2009

(54) HIGH VELOCITY AIR COOLING FOR ELECTRONIC EQUIPMENT

(75) Inventors: Christopher J. Hoffman, Portland, OR (US); Kevin O'Connor, Portland, OR (US)

(73) Assignees: Pacific Star Communications, Portland, OR (US); Portland Design Studio, Inc., Portland, OR (US)

( * ) Notice: Subject to any disclaimer, the term of this patent is extended or adjusted under 35 U.S.C. 154(b) by 471 days.

(21) Appl. No.: 11/435,355

(22) Filed: May 16, 2006

(65) Prior Publication Data

US 2007/0058339 A1    Mar. 15, 2007

Related U.S. Application Data

(60) Provisional application No. 60/716,664, filed on Sep. 13, 2005.

(51) Int. Cl.
*H05K 7/20* (2006.01)
(52) U.S. Cl. ............. 361/697; 361/679.48; 361/679.33; 361/695; 165/80.3; 454/184
(58) Field of Classification Search ................. 361/687, 361/695, 697, 678, 679.33, 679.48, 690–692, 361/699; 165/80.3, 122, 104.33; 454/184, 454/187; 62/259.2; 700/70, 299–300
See application file for complete search history.

(56) References Cited

U.S. PATENT DOCUMENTS

| | | | |
|---|---|---|---|
| 4,674,004 A | 6/1987 | Smith et al. | |
| 4,972,453 A | 11/1990 | Daniel, III et al. | |
| 5,081,707 A | 1/1992 | Schorman et al. | |
| 5,159,685 A | 10/1992 | Kung | |
| 5,171,183 A * | 12/1992 | Pollard et al. | 454/184 |
| 5,197,127 A | 3/1993 | Waclawsky et al. | |

(Continued)

FOREIGN PATENT DOCUMENTS

WO    WO 99/59276    11/1999

(Continued)

OTHER PUBLICATIONS

U.S. Appl. No. 11/677,544, Hoffman et al.

(Continued)

*Primary Examiner*—Jayprakash N Gandhi
*Assistant Examiner*—Courtney Smith
(74) *Attorney, Agent, or Firm*—Perkins Coie LLP

(57) ABSTRACT

Systems and methods for cooling electronic components are disclosed herein. Certain aspects of the invention are directed toward an electronic system that includes an electronic module having a container with at least two openings and multiple manufactured electronic components carried in the container. The electronic module is configured to operate reliably at or above a maximum manufacturer's suggested first ambient temperature while still maintaining the first suggested operating core temperature of the internal electronic module. The system further includes a duct in fluid communication with at least one of the openings and an exterior flow device coupled to the duct. The flow device is configured to produce a pressure differential between an interior and an exterior of the container to cause high velocity air to flow through the container such that the electronic module can be operated in the selected mode at a second ambient temperature greater than the maximum first manufacturer's suggested ambient temperature.

18 Claims, 7 Drawing Sheets

U.S. PATENT DOCUMENTS

| | | | |
|---|---|---|---|
| 5,317,725 A | 5/1994 | Smith et al. | |
| 5,377,196 A | 12/1994 | Godlew et al. | |
| 5,388,189 A | 2/1995 | Kung | |
| 5,422,787 A * | 6/1995 | Gourdine | 361/697 |
| 5,508,941 A | 4/1996 | Leplingard et al. | |
| 5,559,673 A | 9/1996 | Gagnon et al. | |
| 5,657,641 A | 8/1997 | Cunningham et al. | |
| 5,774,331 A | 6/1998 | Sach | |
| 5,808,866 A | 9/1998 | Porter | |
| 5,872,557 A | 2/1999 | Wiemer et al. | |
| 5,875,242 A | 2/1999 | Glaser et al. | |
| 5,917,904 A | 6/1999 | Theis | |
| 5,974,457 A | 10/1999 | Waclawsky et al. | |
| 5,995,376 A | 11/1999 | Schultz et al. | |
| 6,003,068 A | 12/1999 | Sopko | |
| 6,021,042 A | 2/2000 | Anderson et al. | |
| 6,064,571 A | 5/2000 | Noble | |
| 6,094,346 A | 7/2000 | Schweers et al. | |
| 6,111,192 A | 8/2000 | Bell et al. | |
| 6,130,819 A | 10/2000 | Lofland et al. | |
| 6,185,481 B1 | 2/2001 | Kondou et al. | |
| 6,198,628 B1 | 3/2001 | Smith | |
| 6,202,291 B1 | 3/2001 | Toedtman | |
| 6,206,480 B1 | 3/2001 | Thompson | |
| 6,229,698 B1 | 5/2001 | Harvey | |
| 6,242,691 B1 | 6/2001 | Reese et al. | |
| 6,280,318 B1 | 8/2001 | Criss-Puszkiewicz et al. | |
| 6,330,152 B1 | 12/2001 | Vos et al. | |
| 6,345,294 B1 | 2/2002 | O'Toole et al. | |
| 6,360,276 B1 | 3/2002 | Scott | |
| 6,422,730 B1 | 7/2002 | Koren et al. | |
| 6,434,120 B1 | 8/2002 | Natarajan et al. | |
| 6,437,980 B1 | 8/2002 | Casebolt | |
| 6,438,577 B1 | 8/2002 | Owens | |
| 6,487,664 B1 | 11/2002 | Kellum | |
| 6,499,609 B2 | 12/2002 | Patriche et al. | |
| 6,525,935 B2 | 2/2003 | Casebolt | |
| 6,525,936 B2 | 2/2003 | Beitelmal et al. | |
| 6,529,502 B2 | 3/2003 | Sarkissian et al. | |
| 6,535,865 B1 | 3/2003 | Skaaning et al. | |
| 6,538,881 B1 | 3/2003 | Jeakins et al. | |
| 6,545,863 B2 | 4/2003 | Huggins | |
| 6,552,898 B1 | 4/2003 | Noble | |
| 6,567,267 B1 | 5/2003 | Wang et al. | |
| 6,574,104 B2 | 6/2003 | Patel et al. | |
| 6,587,335 B1 | 7/2003 | Nelson et al. | |
| 6,598,183 B1 | 7/2003 | Grieco et al. | |
| 6,603,662 B1 | 8/2003 | Ganrot | |
| 6,614,811 B1 | 9/2003 | Alaimo et al. | |
| 6,646,878 B2 | 11/2003 | Chan | |
| 6,647,015 B2 | 11/2003 | Malkemes et al. | |
| 6,661,657 B1 | 12/2003 | Banton et al. | |
| 6,661,667 B2 | 12/2003 | Robbins et al. | |
| 6,683,787 B1 | 1/2004 | Banton et al. | |
| 6,690,575 B1 | 2/2004 | Banton et al. | |
| 6,691,250 B1 | 2/2004 | Chandiramani et al. | |
| 6,697,255 B1 | 2/2004 | Banton et al. | |
| 6,704,196 B1 | 3/2004 | Rodriguez et al. | |
| 6,719,149 B2 | 4/2004 | Tomino | |
| 6,728,099 B1 * | 4/2004 | Tsang et al. | 361/678 |
| 6,741,463 B1 | 5/2004 | Akhtar et al. | |
| 6,741,466 B1 | 5/2004 | Lebo | |
| 6,747,872 B1 | 6/2004 | Patel et al. | |
| 6,751,096 B2 | 6/2004 | Aldon | |
| 6,759,588 B1 | 7/2004 | Banton et al. | |
| 6,760,218 B2 | 7/2004 | Fan et al. | |
| 6,765,793 B2 | 7/2004 | Kehret et al. | |
| 6,781,831 B1 | 8/2004 | Banton et al. | |
| 6,792,323 B2 | 9/2004 | Krzyzanowski et al. | |
| 6,795,318 B2 | 9/2004 | Haas et al. | |
| 6,801,428 B2 | 10/2004 | Smith et al. | |
| 6,826,708 B1 | 11/2004 | Michalewicz | |
| 6,853,637 B1 | 2/2005 | Norrell et al. | |
| 6,856,816 B2 | 2/2005 | Porter | |
| 6,857,012 B2 | 2/2005 | Sim et al. | |
| 6,862,179 B2 | 3/2005 | Beitelmal et al. | |
| 6,876,548 B2 | 4/2005 | Yatougo et al. | |
| 6,876,736 B2 | 4/2005 | Lamy et al. | |
| 6,879,486 B1 | 4/2005 | Banton et al. | |
| 6,879,973 B2 | 4/2005 | Skaanning et al. | |
| 6,889,376 B1 | 5/2005 | Barritz et al. | |
| 6,906,918 B2 | 6/2005 | Rabinovitz | |
| 6,909,611 B2 | 6/2005 | Smith et al. | |
| 6,924,978 B2 | 8/2005 | DiStefano | |
| 6,944,022 B1 | 9/2005 | Kehret et al. | |
| 6,967,841 B1 | 11/2005 | Chu et al. | |
| 6,968,958 B2 | 11/2005 | Lauchner et al. | |
| 6,985,357 B2 | 1/2006 | Cauthron | |
| 6,990,661 B2 | 1/2006 | Dobbek | |
| 6,993,614 B2 | 1/2006 | Le et al. | |
| 6,995,978 B2 | 2/2006 | Strauss et al. | |
| 7,002,793 B2 | 2/2006 | Imsand | |
| 7,012,805 B2 | 3/2006 | Shah et al. | |
| 7,023,693 B2 | 4/2006 | Yuan et al. | |
| 7,345,875 B2 * | 3/2008 | Elkins | 361/695 |
| 2001/0008482 A1 | 7/2001 | Corisis et al. | |
| 2002/0061024 A1 | 5/2002 | Malkemes et al. | |
| 2002/0072345 A1 | 6/2002 | Toth et al. | |
| 2002/0114325 A1 | 8/2002 | Dale et al. | |
| 2002/0161873 A1 | 10/2002 | McGuire | |
| 2002/0167935 A1 | 11/2002 | Nabkel et al. | |
| 2002/0176404 A1 | 11/2002 | Girard | |
| 2003/0041237 A1 | 2/2003 | Mcelroy et al. | |
| 2003/0051008 A1 | 3/2003 | Gorthy et al. | |
| 2003/0137532 A1 | 7/2003 | Proulx et al. | |
| 2003/0150823 A1 | 8/2003 | Dean et al. | |
| 2003/0161453 A1 | 8/2003 | Veschi | |
| 2003/0214782 A1 * | 11/2003 | Osborn et al. | 361/687 |
| 2003/0235198 A1 | 12/2003 | McElroy et al. | |
| 2004/0001088 A1 | 1/2004 | Stancil et al. | |
| 2004/0003073 A1 | 1/2004 | Krzyzanowski et al. | |
| 2004/0008717 A1 | 1/2004 | Verma et al. | |
| 2004/0089618 A1 | 5/2004 | Lauchner et al. | |
| 2004/0111574 A1 | 6/2004 | Pina et al. | |
| 2004/0111598 A1 | 6/2004 | Jordan et al. | |
| 2004/0111599 A1 | 6/2004 | Jordan et al. | |
| 2004/0125558 A1 | 7/2004 | DiStefano | |
| 2004/0130557 A1 | 7/2004 | Lin et al. | |
| 2004/0131172 A1 | 7/2004 | Gill | |
| 2004/0133734 A1 | 7/2004 | Jordan et al. | |
| 2004/0133888 A1 | 7/2004 | Ard et al. | |
| 2004/0136373 A1 | 7/2004 | Bareis | |
| 2004/0142711 A1 | 7/2004 | Mahonen et al. | |
| 2004/0165544 A1 | 8/2004 | Cornett et al. | |
| 2004/0190229 A1 | 9/2004 | Caci et al. | |
| 2004/0198386 A1 | 10/2004 | Dupray | |
| 2004/0215999 A1 | 10/2004 | Otto et al. | |
| 2005/0047098 A1 | 3/2005 | Garnett et al. | |
| 2005/0054289 A1 | 3/2005 | Salazar et al. | |
| 2005/0060543 A1 | 3/2005 | Anspach | |
| 2005/0089052 A1 | 4/2005 | Chen et al. | |
| 2005/0099766 A1 | 5/2005 | Fraley et al. | |
| 2005/0128689 A1 | 6/2005 | Caci et al. | |
| 2005/0168926 A1 | 8/2005 | Lee et al. | |
| 2005/0188092 A1 | 8/2005 | Short et al. | |
| 2005/0198233 A1 | 9/2005 | Manchester et al. | |
| 2005/0198239 A1 | 9/2005 | Hughes | |
| 2005/0199459 A1 | 9/2005 | Harvey | |
| 2005/0201053 A1 | 9/2005 | Scicluna et al. | |
| 2005/0213306 A1 | 9/2005 | Vos et al. | |
| 2005/0232284 A1 | 10/2005 | Karaoguz et al. | |
| 2005/0237716 A1 | 10/2005 | Chu et al. | |
| 2005/0241810 A1 * | 11/2005 | Malone et al. | 165/122 |
| 2005/0248043 A1 | 11/2005 | Bettridge et al. | |

| | | |
|---|---|---|
| 2005/0254210 A1 | 11/2005 | Grady et al. |
| 2005/0259383 A1 | 11/2005 | Ewing et al. |
| 2006/0015674 A1 | 1/2006 | Murotake |
| 2006/0018094 A1 | 1/2006 | Robbins et al. |
| 2006/0019655 A1 | 1/2006 | Peacock |
| 2006/0022562 A1 | 2/2006 | Li |
| 2006/0026509 A1 | 2/2006 | Porter |
| 2006/0034053 A1 | 2/2006 | Parish et al. |
| 2006/0044775 A1 | 3/2006 | Hoshino et al. |
| 2006/0050477 A1 | 3/2006 | Wu et al. |
| 2006/0071581 A1 | 4/2006 | Harvey |
| 2006/0232930 A1* | 10/2006 | Artman et al. ............. 361/695 |
| 2007/0109984 A1 | 5/2007 | Buchholz et al. |
| 2007/0133168 A1* | 6/2007 | Shabany ..................... 361/695 |

FOREIGN PATENT DOCUMENTS

| | | |
|---|---|---|
| WO | WO-02/091692 | 11/2002 |
| WO | WO-2004/085622 | 10/2004 |
| WO | WO 2007/044880 A2 | 4/2007 |

OTHER PUBLICATIONS

U.S. Appl. No. 11/677,555, Kawasaki et al.
U.S. Appl. No. 60/880,154, Kawasaki.
U.S. Appl. No. 60/916,459, Ralstin et al.
"BATM/Telco Systems Management Tools." BATM Telco Systems. 4 pages.
"Chapter 5: Network Management Tools." Cisco IOS VPN Configuration Guide. 16 pages.
"VPN-1 Edge Appliances." Check Point Software Technologies Ltd. 4 pages.
Banton, Randy and Jaenicke, Richard. "Finely Managed Air Cooling for Deployed Military Environments." COTS Journal. Nov. 2003. 4 Pages.

* cited by examiner

HIGH VELOCITY AIR COOLING FOR ELECTRONIC EQUIPMENT

CROSS REFERENCE TO RELATED APPLICATIONS

The present application claims the benefit of U.S. Provisional Patent Application No. 60/716,664 filed on Sep. 13, 2005, entitled HIGH VELOCITY AIR COOLING FOR ELECTRONIC EQUIPMENT, the entirety of which is incorporated herein by reference.

TECHNICAL FIELD

The present invention is related to systems and methods for cooling electronic components.

BACKGROUND

The use of electronic equipment to perform various tasks, manage data, and provide communication is becoming more and more prevalent in daily life. For example, the military and private industry often desire/require rugged mobile electronic communication equipment that is easy to set-up and use in the field, able to withstand harsh operating environments, such as extreme temperatures and dusty conditions, and is inexpensive to produce and maintain.

In order to keep production and maintenance costs low, it is often desirable to build the electronic equipment using off-the-shelf electronic modules. For example, development cost can be reduced or eliminated by integrating existing computer modules, power supply modules, and/or telecommunication modules in an electronic system.

A problem with using off-the-shelf modules is that they are often designed for use in fairly benign operating environments, such as homes or office buildings. Accordingly, many of the modules are not well suited for harsh operating environments. For example, an electronic module may not be designed to operate above an elevated ambient operating temperature.

The maximum rated operating internal temperature of the module is often a function of the amount of heat produced by the various electronic components inside the module during operation, the maximum operating core temperature limits of those components, and the amount of heat expected to be removed from the module during operation at the maximum rated operating ambient air temperature (e.g., the amount of heat expected to be removed by a built-in cooling fan inside the module). For example, if the ambient air temperature rises above the maximum rated operating ambient temperature for the module, at least one of the electronic components inside the module is likely to reach a core temperature above the maximum operating temperature for the corresponding electronic component(s). In some cases, this elevated temperature can reduce the operating life of the module or cause the module to fail. Even if the individual maximum operating core temperature limits of the electronic components inside the module are high, the maximum ambient internal operating temperature of the module may be fairly low because only a small amount of heat is expected to be removed from the module during operation.

Similarly, an electronic module may not be designed to operate in dusty conditions. Electronic modules used in homes and office buildings are generally not exposed to high dust-content environments. When these modules are exposed to dusty conditions, the dust can affect the operation of the module, as well as the module cooling. Accordingly, off-the-shelf components are often not well suited for dusty operating environments.

SUMMARY

The present invention is directed generally toward systems and methods for cooling electronic components. Certain aspects of the invention are directed toward an electronic system that includes an electronic module having a housing and multiple electronic components carried in the housing. In one embodiment, the electronic module is carried by a container. The housing has at least two openings configured to allow air to flow between an interior of the housing and an exterior of the housing to facilitate cooling of the electronic components. The electronic module is configured to operate in a mode below a maximum rated operating ambient air temperature without the multiple electronic components exceeding their individual corresponding maximum core operating temperature limits. The system further includes an air channeling device that defines a pathway to force external air to flow though an electronic module. At least a portion of the air channeling device is exterior to the housing and in fluid communication with at least one of the openings. The system still further includes a flow device located exterior to the housing and coupled to the air channeling device. The flow device is positioned and configured to produce a pressure differential between the interior of the housing and the exterior of the housing to cause air to flow through the housing such that the electronic module can be operated in the mode at a second ambient air temperature greater than the maximum rated operating first ambient air temperature without the multiple electronic components exceeding their individual corresponding maximum core operating temperature limits.

Other aspects of the invention are directed toward a method for cooling electronic equipment that includes an electronic module having multiple heat producing electronic components in a housing and an internal cooling system that enables air to move through the housing at up to a first velocity relative to the electronic components. The housing has a least two openings configured to allow air to flow between an interior of the housing and an exterior of the housing to facilitate extracting heat energy from the electronic components. The electronic components have individual maximum internal operating temperature limits within the housing. The method further includes operably coupling an air directing structure to a flow device located exterior to the housing and configured to produce a pressure differential between the interior of the housing and the exterior of the housing to cause air to flow through the housing at a second velocity greater than the first velocity such that the heat producing electronic module can be operated at a second or variable higher ambient air temperature.

DETAILED DESCRIPTION

Figure 1A:
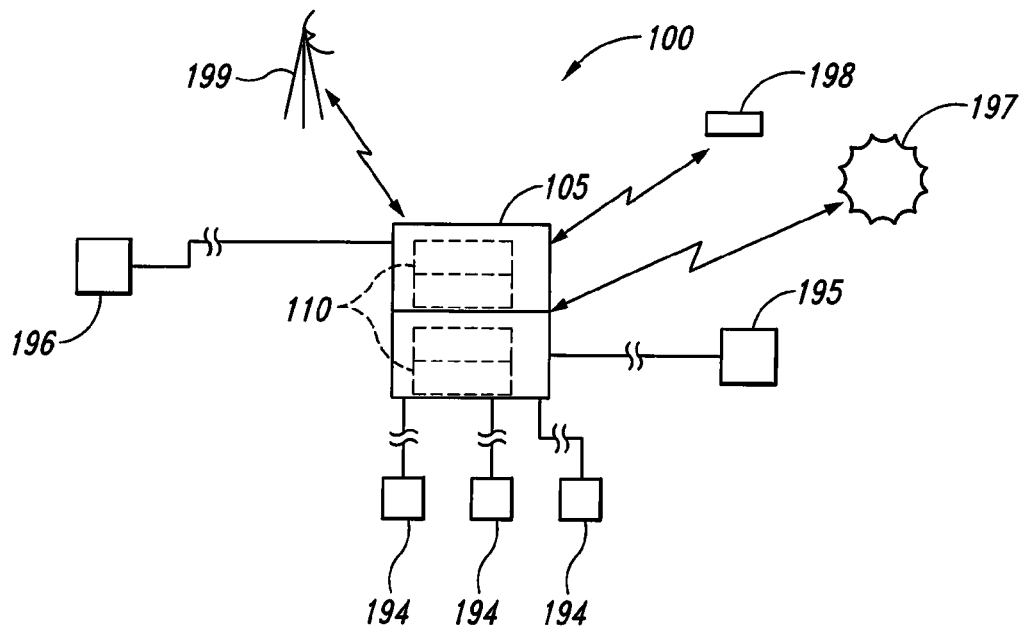
FIG. 1A is a partially schematic illustration of an electronic communications system in accordance with certain embodiments of the invention.

The present disclosure describes systems and methods for cooling electronic components. Several specific details of the invention are set forth in the following description and in FIGS. 1-8 to provide a thorough understanding of certain embodiments of the invention. One skilled in the art, however, will understand that the present invention may have additional embodiments, and that other embodiments of the invention may be practiced without several of the specific features described below.

FIG. 1 is a partially schematic illustration of an electronic system 105 in accordance with certain embodiments of the invention. In FIG. 1, the electronic system 105 of the illustrated embodiment includes network switching equipment that is part of a communications and computing system 100 or computing environment. In the illustrated embodiment, the electronic system 105 includes a plurality of electronic modules 110 operably coupled together and configured to exchange information with various other elements of the computing system 100. For example, the electronic system 105 can be configured to communicate with one or more computing devices 194 via a wired and/or wireless connection (e.g., providing a local-area network). The computing devices can include personal computers, hand-held or laptop devices, multiprocessor systems, microprocessor-based systems, programmable consumer electronics, digital cameras, network PCs, minicomputers, cell phones, personal digital assistants, smart phones, and so on.

The electronic system 105 can also be configured to exchange information with, or be a portion of, one or more additional elements, including one or more additional networks. For example, in FIG. 1 the electronic system 105 can be connectable to a public switched telephone network 196 via a wire or an optical conduit, communicate with the Internet 197 or other wide-area or local-area networks, communicate with various aerospace vehicles 198 (e.g., a satellite), and communicate with various antenna based networks 199 (e.g., cellular-phone networks, radio networks, and/or microwave communications systems). In the illustrated embodiment, the electronic system 105 can be used to communicate with any of the elements described above and/or to provide communication between any of these elements.

Figure 1B:
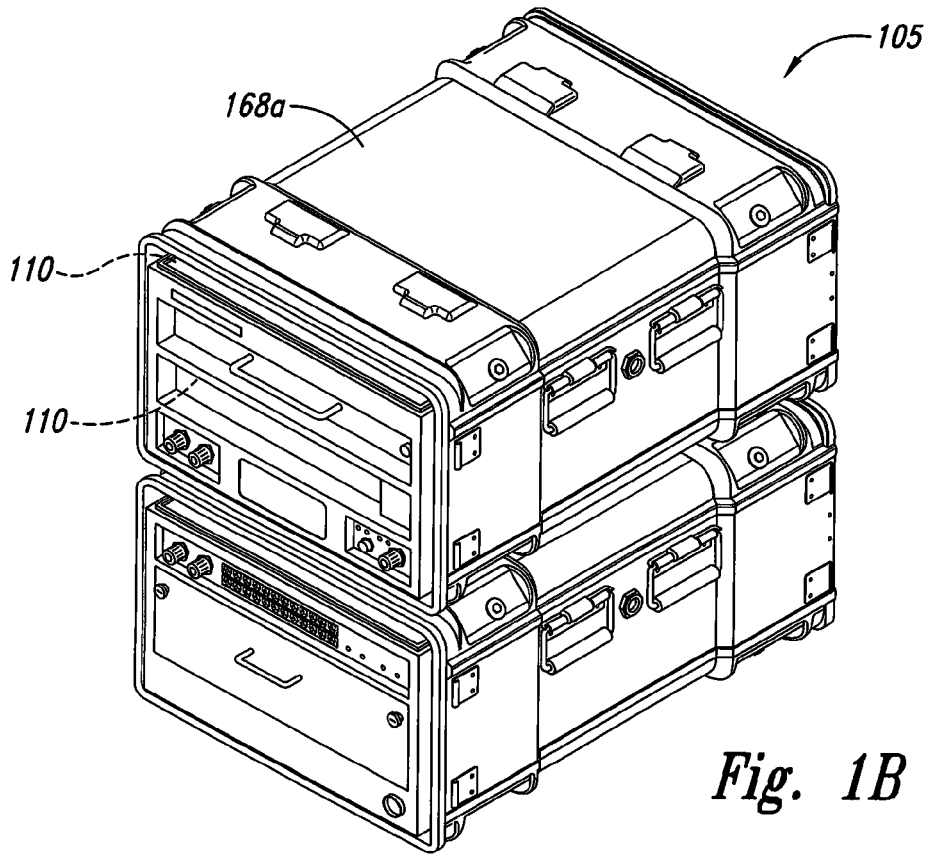
FIG. 1B is an enlarged isometric view of an electronic system of the system of FIG. 1A.

In the illustrated embodiment shown in FIG. 1B, the electronic system 105 is configured to be mobile, rugged, and capable of operating in harsh environments (e.g., hot and dusty conditions). Accordingly, the electronic system 105 shown in FIGS. 1A and 1B can be easily moved from one location to another and set up to provide network switching capability while at each location. Additionally, the electronic system 105 is configured to operate on an internal battery and/or to be coupled to an electrical power source 195. In other embodiments, the electronic system 105 can have other configurations, perform other tasks or functions, and/or be coupled to other elements.

Figure 2:
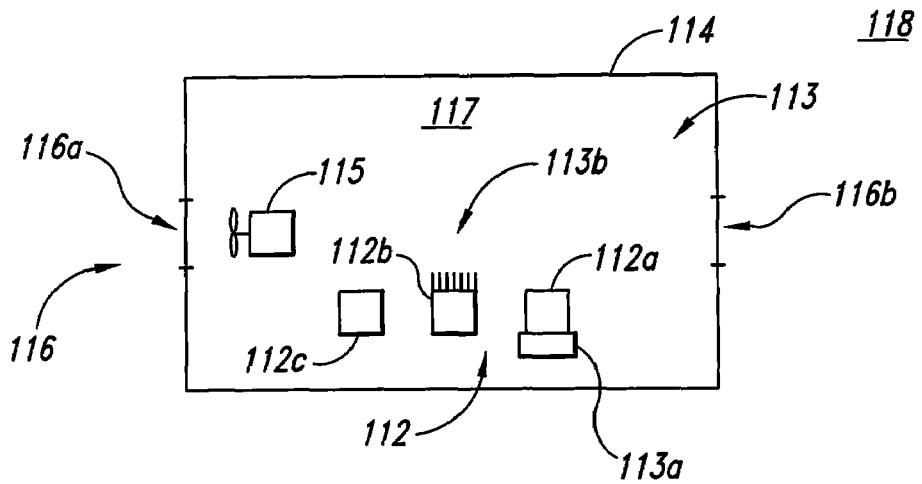
FIG. 2 is a partially schematic cross-sectional side elevation view of an electronic module of the system in accordance with selected embodiments of the invention.

FIG. 2 is a partially schematic cross-sectional side elevation of an electronic module 110 used in the electronic system 105 shown in FIG. 1. The electronic module 110 includes multiple heat producing electronic components 112, shown in FIG. 2 as a first electronic component 112a, a second electronic component 112b, and third electronic component 112c. The electronic components 112 are carried in an interior 117 of a housing 114. The housing 114 has at least two openings, shown as a first opening 116a and a second opening 116b (referred to collectively as openings 116) that allow air to flow between an exterior 118 of the housing 114 and the interior 117 of the housing 114 to facilitate cooling of the electronic components 112.

The electronic module 110, shown in FIG. 2, includes various heat dissipating or radiating devices 113, shown as a first heat dissipating device 113a and a second heat dissipating device 113b. The heat dissipating devices 113 can aid in carrying heat away from selected electronic components. In FIG. 2, the first heat dissipating device 113a includes a heat sink coupled to the first electronic device 112a and the second heat dissipating device 113b includes multiple cooling fins coupled to the second electronic device 112b. In the illustrated embodiment, the electronic module 110 includes a cooling fan 115 positioned in the interior 117 of the housing 114 and configured to move air through the housing 114 to remove heat from the electronic components 112 and the heat dissipating devices 113.

In the illustrated embodiment, the electronic module 110 of the illustrated embodiment is a commercial off-the-shelf unit configured to operate in an environment where ambient air temperatures are typically maintained at moderate levels and dust or contaminant levels are generally low. Accordingly, the electronic module 110 is configured to operate in a selected mode below a maximum rated operating ambient air temperature without any of the electronic components 112 exceeding their corresponding individual maximum operating temperature limits. Typically, electronic modules 110 are typically engineered from the factory with an integrated cooling system based on a fixed air-flow and/or heat sink combination. As a result of its fixed or maximum air-flow, the ambient air temperature cannot exceed the rated maximum temperature without at least one of the electronic components 112 exceeding its corresponding individual maximum core operating temperature. For example, the electronic module 110 can be configured to operate reliably in an environment with a maximum ambient air temperature of 90 degrees Fahrenheit without any of the individual electronic components 112 in the module exceeding their individual maximum operating temperature limits.

The electronic module 110 can also be configured so that it cannot be operated at an ambient air temperature greater than 90 degrees Fahrenheit without a danger of at least one of the multiple electronic components 112 exceeding its maximum operating temperature limit. The reason for this limitation is typically based on production cost or internal space constraints of the electronic module 10 wherein the engineered cooling system is sized for a particular operational environment and no more. The ability to use higher ambient air temperature to extract the same thermal energy per minute from a heat producing module is derived through passing more air volume over the heat producing module in the same period of time. This thermal dynamics effect can be more accurately explained by saying that in a fixed time period one molecule of air at 90 deg Fahrenheit can extract a fixed amount of thermal energy as it passes over a heated object. In the same time period a molecule of air at, for example 120 deg Fahrenheit, will extract less energy. To make up for the difference in energy removed per time period, more air molecules must pass the heated object in the same time frame. When trying to maintain the temperature of a module with a fixed radiating surface and a fixed amount of radiated heat energy to be removed, the only variable that can be changed is the air flow.

Because the electronic module 110 in FIG. 2 is configured to operate in a controlled environment, the module 110 is not designed to operate in dusty conditions (i.e., a relatively high concentration of particulates or contaminates in the air). Accordingly, if the module 110 where operated in dusty environments, airborne particles or other contaminates can easily enter the interior 117 of the housing 114 and potentially interfere with the operation of the module 110 or the cooling of the electronic components 112. Additionally, because the electronic module 110 in FIG. 2 is configured to be set-up and run in a controlled environment, the module 110 is not configured to be routinely moved from one location to another. Accordingly, the housing 114 of the module 110 is not configured to be subjected to carriage or shipping without being placed in protective packaging.

Figure 3:
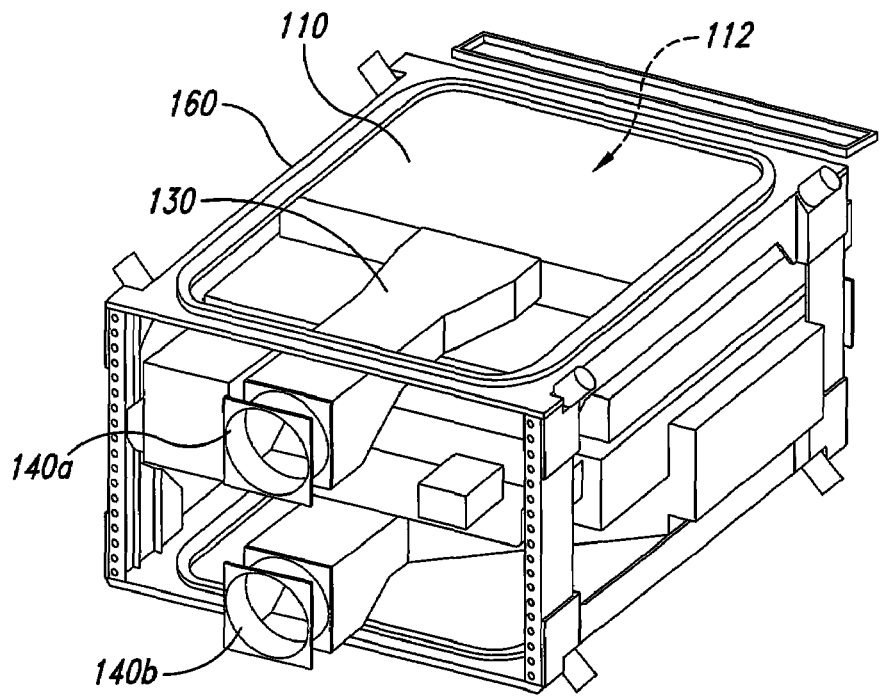
FIG. 3 is a partially schematic isometric illustration of a support structure with electronic modules shown therein.

FIG. 3 is a partially schematic isometric illustration of a rugged support structure 160 used to carry, enclose, and protect the electronic modules 110 in the electronic system 105 shown in FIG. 1. In various embodiments, the support structure 160 can be configured to carry electronic modules 110 that are operably coupled together to operate as a unit. For example, in the illustrated embodiment the support structure 160 is configured to carry two electronic modules 110 for purposes of illustration. In certain embodiments, the support structure 160 can provide structural integrity to protect and/or facilitate the transport of the electronic module(s).

Figure 4:
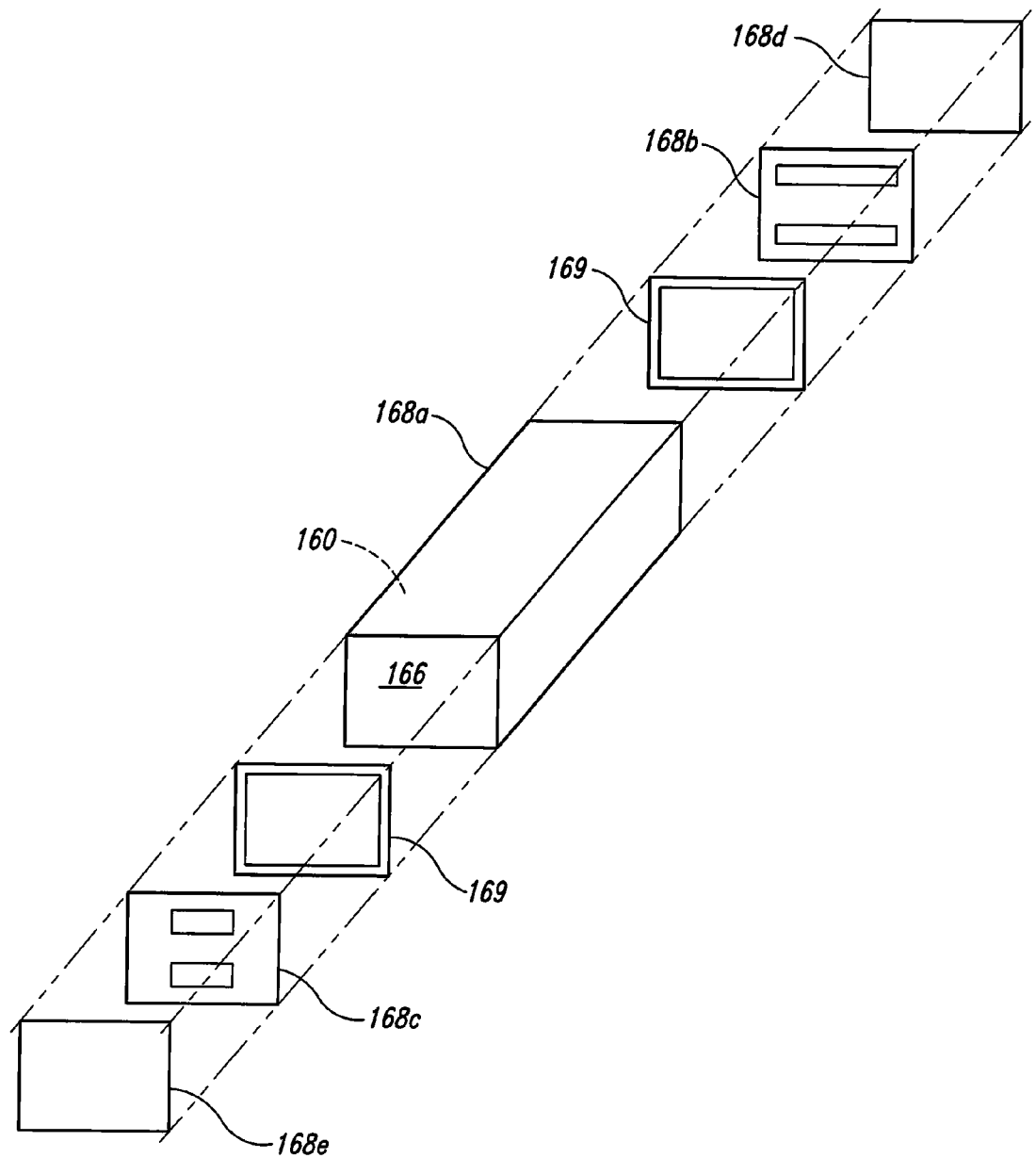
FIG. 4 is a partially schematic isometric illustration of an enclosure in accordance with selected embodiments of the invention.

FIG. 4 is a partially schematic isometric illustration of a rugged enclosure 165 used to carry the support structure 160 and the electronic modules 110 in the electronic system shown in FIG. 1. In the illustrated embodiment, the enclosure includes multiple portions 168, shown as a first portion 168a, a second portion 168b, a third portion 168c, a fourth portion 168d, and a fifth portion 168e. In the illustrated embodiment, the first portion 168a includes four sides forming a hollow or passageway running between two open ends. Additionally, in selected embodiments the enclosure 165 can include seals 169 that can be positioned between various portions 168 of the enclosure 165 when the enclosure 165 is assembled. As discussed in further detail below, when assembled, the multiple portions 168 of the enclosure 165 can form an interior 166 in which the support structure 160, shown in FIG. 3, can be securely fixed and carried. In other embodiments, the enclosure 165 can have other configurations. For example, in certain embodiments the enclosure 165 can include panels or other portions that are connected to portions of the support structure 160 to form predefined volumetrically confined zones. These zones can act to direct air flow or restrict air to pass though one or more openings such as inlet filters 175a and 175b or exhaust fans 140a and 140b. In still other embodiments, the frame and the enclosure can be integral with one another.

Figure 5:
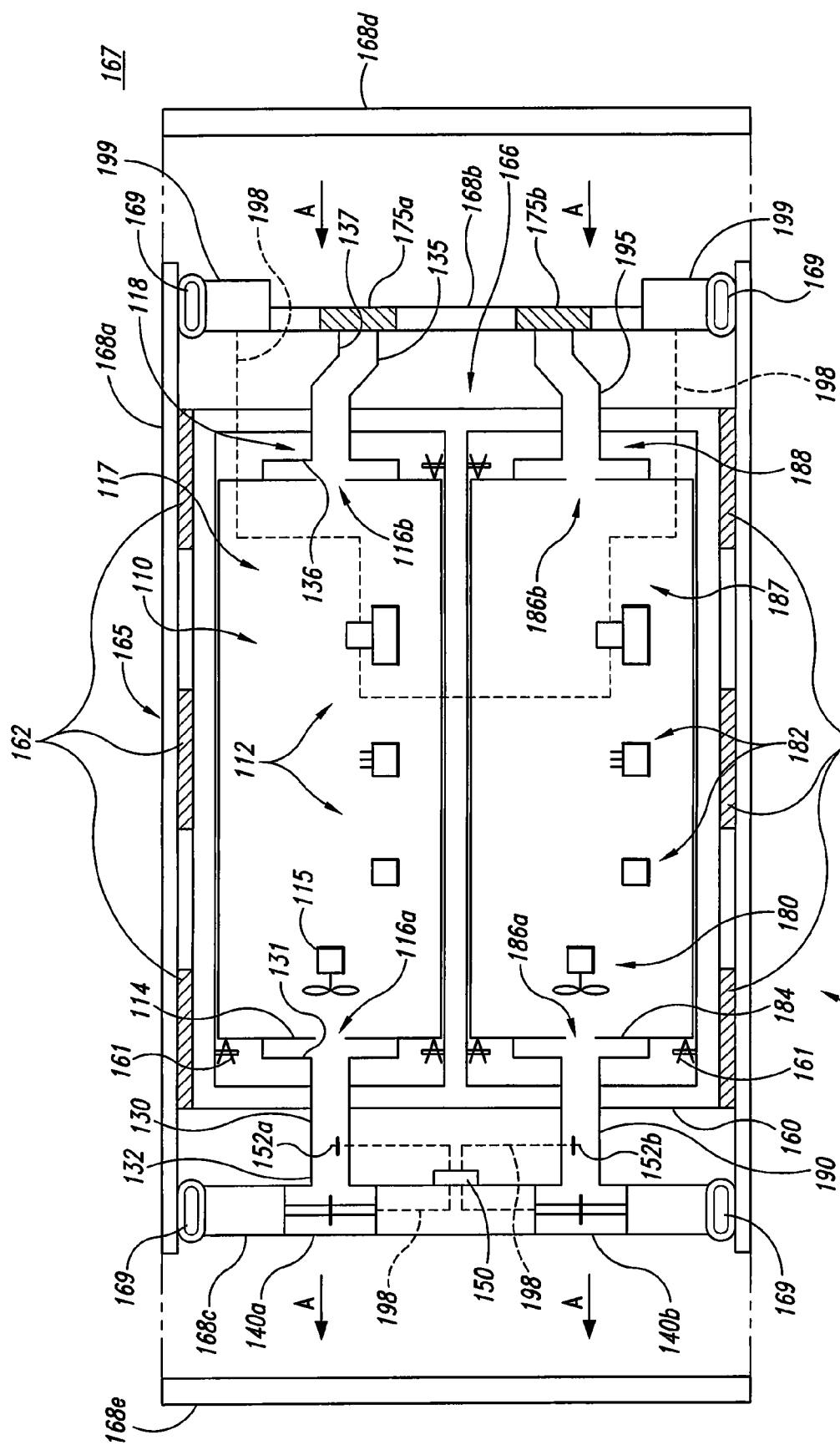
FIG. 5 is a partially schematic cross-sectional side elevation view of an electronic system that comprises the electronic module shown in FIG. 2, the support shown in FIG. 3, and the enclosure shown in FIG. 4, in accordance with various embodiments of the invention.

FIG. 5 is a partially schematic cross-sectional side elevation of the electronic system 105, shown in FIG. 1, which includes the electronic modules 110 shown in FIG. 2, the support structure 160 shown in FIG. 3, and the enclosure 165 shown in FIG. 4. In FIG. 5, the support structure 160 is carried in the interior 166 of the enclosure 165 with spacers 162 or shock mounts positioned between the support structure 160 and the enclosure 165. In selected embodiments, the support structure 160 can be coupled or connected to the enclosure 165 via the spacers 162 using an adhesive or using connectors such as a bolts, screws, fasteners, or the like. In the illustrated embodiment, the spacers 162 include a shock and/or vibration absorbent material. In other embodiments the spacers 162 can have other configurations and/or the support structure 160 can be connected directly to the enclosure 165 without any spacers 162.

The support structure 160, in turn, carries the electronic modules 110. In the illustrated embodiment, the support structure 160 also carries two electronic modules 110, although other embodiments can include more than two electronic modules 110. In the illustrated embodiment, the first electronic module 110 is coupled to the support structure 160 via connectors 161. In other embodiments, the first electronic module 110 can be held in place via other methods. For example, in other embodiments the support structure 160 can be configured to hold the electronic module 110 in place via the placement of various integrally formed members of the support structure 160 and/or the position of various portions of the enclosure 165.

In the illustrated embodiment, the second and third portions 168b and 168c of the enclosure 165 are positioned at opposite ends of the first portion 168a of the enclosure 165. One of the seals 169 is positioned between the second portion 168b and the four sides of the first portion 168a of the enclosure 165 to prevent dust and debris from entering the interior 166 of the enclosure 165 between the first and second portions 168a and 168b. Similarly, another of the seals 169 is positioned between the third portion 168c and the fours sides of the first portion 168a of the enclosure 165 to prevent dust and debris from entering the interior 166 of the enclosure 165 between the first and third portions 168a and 168c.

In FIG. 5, a first duct 130 extends between the first electronic module 110 and the third portion 168c of the enclosure 165. In the illustrated embodiment, the first duct 130 is exterior of the first module 110 and in fluid communication with the first opening 116a of the first module 110, such as an air outlet. The first duct 130 includes a first portion 131 proximate to the first opening 116a and a second portion 132 proximate to the third portion 168c of the enclosure 165. In other embodiments, the first duct 130 can have other arrangements. For example, in other embodiments the first duct 130 is not directly attached to the first module 110 and/or the third portion 168c of the enclosure 165 but is securely held adjacent to the first module 110 and the third portion 168c. In still other embodiments, the first duct 130 is mounted to or otherwise coupled to the support structure 160. In other embodiments, one or more air channeling devices can be used instead of a duct or there is no duct at all but a confined and substantially sealed volume or plenum that directs air flow to enter at one end or side of the electronic module 110, through the electronic module, and exit out another end or side.

In the illustrated embodiment, a second duct 135 extends between the first electronic module 110 and the second portion 168b of the enclosure 165. In the illustrated embodiment, the second duct 135 is also exterior of the first module 110 and in fluid communication with the second opening 116b of the first module 110, such as an air inlet. The second duct 135 includes a first portion 136 proximate to the second opening 116b and a second portion 137 proximate to the second portion 168b of the enclosure 165. In FIG. 5, the second duct 135 is coupled or connected to the first module 110 and to the second portion 168b of the enclosure 165. In other embodiments, the second duct 135 can have other arrangements. For example, in other embodiments the second duct 135 is not directly attached to the first module 110 and/or the second portion 168b of the enclosure 165. In still other embodiments, the second duct 135 is mounted or otherwise coupled to the support structure 160. In other embodiments, one or more air channeling devices can be used instead of a duct or there is no duct at all but a confined and substantially sealed volume or plenum that directs air flow to enter at one end or side of the electronic module 110, through the electronic module, and exit out another end or side.

In FIG. 5, the second portion 168b of the enclosure 165 carries two filters, shown as a first filter 175a and a second filter 175b. In the illustrated embodiment, the first filter 175a is positioned so that air flowing through the filter passes between an exterior 167 of the enclosure 165 and the interior of the housing 114 of the first module 110. In other embodiments, the first filter 175a can have other configurations and/or other positions.

In the illustrated embodiment, the third portion 168c of the enclosure 165 carries a first flow control device 140a and a second flow control device 140b. The first flow control device 140a is positioned (e.g., operably coupled to the first duct 130) and configured to produce a pressure differential between the interior 117 of the housing 114 of the first module 110 and the exterior 118 of the housing 114 to cause air to flow at high velocities through the housing 114 and across the electronic components 112 of the first module 110. For example, the first flow device 140a can include a high velocity blower, a fan, a pump, or the like. In selected embodiments, the high velocity airflow generated by the first flow device 140a can allow the first electronic module 110 to operate in a selected mode at an ambient air temperature higher than the maximum-rated operating ambient air temperature for which the first module 110 was originally configured to operate.

For example, the first flow control device 140a can produce a pressure differential that causes high velocity air A to flow from the exterior 167 of the enclosure 165, through the first filter 175a, through the second duct 135, through the second opening 116b, through the interior 117 of the housing 114 of the first electronic module 110, past the electronic components 112, through the first opening 116a, through the first duct 130, through the first flow device 140a, and to the exterior 167 of the enclosure 165. The high velocity airflow can remove heat from the first electronic module 110, above and beyond that which would be removed without the first flow device 140a (e.g., by the internal fan 115 of the first electronic module 110 alone). In the illustrated embodiment, the first flow device 140a generates air to flow at high velocities and/or at a high volumetric flow rates, such as a flow rate of 300 cubic foot per minute, to increase cooling efficiency.

High velocity airflow and/or high volumetric air flow rates through the electronic modules 110 allows for the removal of more heat from the interior of the first module 110 in the same time period (and the electronic components 112 therein) and/or the enclosure 165 even when the ambient air temperature is above the maximum rated operating ambient air temperature, thereby allowing the first module 110 to operate at elevated ambient temperatures. Additionally, the high velocity air flow can increase cooling efficiency because the higher velocity air can be more turbulent than lower velocity air, thereby maximizing convective type cooling by disrupting typical laminar air flow patterns. In some embodiments, other techniques can be used to increase the turbulence and/or movement of the air.

In FIG. 5, a second electronic module 180 is similar to the first electronic module 110. The second electronic module 180 is carried in the support structure 160 and the enclosure 165 in a manner similar to the way the first electronic module 110 is carried. Additionally, a third duct 190 extends between the third portion 168c of the enclosure 165 and the second module 180. A portion of the third duct 190 is proximate to and in fluid communication with an air outlet opening 186a of the second module 180. A fourth duct 195 extends between the second portion 168b of the enclosure 165 and the second module 180. A portion of the fourth duct 195 is located proximate to and in fluid communication with an air inlet opening 186b of the second module 180.

The second flow control device 140b is positioned and configured to produce a pressure differential between the interior 187 of the housing 184 of the second module 180 and the exterior 188 of the housing 184 to cause air to flow through a housing 184 of the second module 180. For example, the second flow control device 140b can produce a pressure differential that causes high velocity air A to flow from the exterior 167 of the enclosure 165, through the second filter 175b, through the fourth duct 195, through the second air inlet 186b of the second module 180, through the interior 117 of the second module 180, past electronic components 182 of the second module 180, through the first opening 186a of the second module 180, through the third duct 190, through the second flow device 140b, and to the exterior 167 of the enclosure 165. air outlet discussed above with reference to the first electronic module 110, in selected embodiments this high velocity airflow can allow the second electronic module 180 to operate in the selected mode at an ambient air temperature that is higher than the maximum ambient air temperature in which the second electronic module 180 was originally configured to operate (e.g., configured to operate without the second flow device 140b).

In the illustrated embodiment, the first and second electronic modules 110 and 180 have dedicated cooling airflows that takes ambient air from outside the enclosure, pass it through the corresponding module, and returns the air to the outside of the enclosure. For instance, in FIG. 5 the first flow device 140a is configured to produce a pressure differential between the interior 117 and the exterior 118 of the housing 114 of the first electronic module 110, and so as not to produce a pressure differential between an interior 187 and an exterior 188 of the housing 184 of the second electronic module 180 (or any other electronic module). Accordingly, in selected embodiments it is possible to control the airflow through each module independently.

For example, in the illustrated embodiment a first temperature sensor 152a is located in the first duct 130 and a second temperature sensor 152b is located in the third duct 190. In the illustrated embodiment, the first and second temperature sensors 152a and 152b are operably coupled to a controller 150 via signal paths 198 (e.g., via electrical, fiber optic, and/or wireless connections). In turn, the controller is operably coupled to the first and second flow devices 140a and 140b via additional signal paths 198. Accordingly, the controller 150 can control the pressure differential created by the first and second flow devices 140a and 140b based on the sensed temperature of the air exiting the first and second electronic modules 110 and 180, respectively. This feature can allow the first and second flow devices 140a and 140b to maintain their respective modules at a selected internal core operating temperature without having to constantly operate at a maximum pressure differential and/or flow rate (e.g., in some case, at lower temperatures the pressure differential can be reduced or zero). When the electronic system 105 is operating on battery power, this feature can allow battery power to be conserved when operating at less than maximum ambient air temperatures and also reduces the fan noise of the system when not needed.

In other embodiments, the controller 150, the first sensor 152a, and the second sensors 152b can have other configurations. For example, in other embodiments electronic system 105 can include more, fewer, and/or different sensors and controllers. For instance, in selected embodiments the sensors 152a and 152b can include flow rate or air velocity sensors. In other embodiments, each module can include its own controller. In certain embodiments, the electronic system includes one controller and one sensor and all of the flow devices are controlled by the single controller based on the temperature sensed in a single module (e.g., where the single module has the lowest operating temperature limits). In still other embodiments, the sensor can sense local temperatures in other locations relative to the electronic system 105. For example, in selected embodiments the sensors can be configured to sense the temperature of various electronic components within a module (e.g., the surface temperature or internal temperature of a selected component).

As shown in FIG. 5, in certain embodiments first and second modules 110 and 180 can be substantially sealed within the enclosure 165 so that air generally only passes between the exterior 167 of the enclosure 165 and the interior 166 of the enclosure 165 through the first and second flow devices 140a and 140b and the first and second filters 175a and 175b. In selected embodiments the first and second flow devices 140a and 140b can include filter elements or one way flow devices (e.g., a flapper valve) to prevent air, dust, and/or debris from entering the first and second flow devices 140a and 140b when the flow devices are not producing a pressure differential. Additionally, the first and second modules 110 and 180 can be operably coupled together (e.g., via one or more signal paths 198) as well as being physically coupled together by the support structure 160 and the enclosure 165 so that they are protected, easy to transport from one location to another, easy to set-up for their intended operation.

Various interfaces 199 can be carried on a portion of the enclosure 165 and operable coupled to one or more of the modules via signal paths 198. The interfaces 199 can include control inceptors, connection ports, power receptacles, and the like. To further protect the electronic system 105 during transport, the fourth and fifth portions 168d and 168e can be face plates or similar structures placed over and/or coupled to the first portion 168a of the enclosure to provide protection to the first and second flow devices 140a and 140b, the first and second filters 175a and 175b, and the interfaces 199. In selected embodiments, the fourth and fifth portions 168d and 168e of the enclosure 165 can seal against the first portion 168a of the enclosure 165 to form an airtight and/or water tight vessel in which the first and second modules 110 and 180 are carried.

A feature of some of the embodiments described above is that a flow device and duct can be used to increase heat removal from an electronic module. Additionally, in many cases, it can be relatively inexpensive to add the flow device and duct to the electronic module. This feature can allow an electronic system that is configured to be set-up and operate in a controlled environment to be operated in an environment with ambient air temperatures that exceed the maximum ambient air temperature in which the module was intended to operate. Accordingly, a commercial off-the-shelf component configured to operate in a controlled environment can be used to produce electronic systems intended to be used in harsh operating environments. An advantage of this feature is that by using commercial off-the-shelf equipment, development and production costs can be reduced over those associated with designing equipment specifically configured for the high temperature operating environments. By adding cooling capacity to the exterior of a standard device and thereby not opening or tampering with the internal cooling system of the electronic module the manufacturer's warranty for the module can be preserved. Additionally, various combinations of supports, enclosures, and/or filters can be used to provide the electronic system with mobility, ruggedness, and dust/debris protection.

In other embodiments, the electronic system can have other configurations, including more, fewer, and/or different electronic modules, ducts, flow devices, filters, supports, and enclosures. For example, in certain embodiments one or more of the ducts can be integral with the enclosure 165. For instance, in selected embodiments the first duct 130 can be formed in, or be part of, the third portion 168c of the enclosure 165. In other embodiments the first electronic module 110 is carried in a support structure 160 without an enclosure 165 and the first flow device 140a is coupled to the first duct 130 and the first filter 175a is coupled to the second duct 135. Accordingly, the first flow device 140a, the first duct 130, the second duct 135, the first filter 175a, and the first electronic module 110 are coupled to and carried by the support structure 160, and are easily moveable from one location to another. In still other embodiments, the module 110 can carry the first duct 130 and the second duct 135 without a support structure 160 or enclosure 165. For example, the first and second ducts 130 and 135 can be coupled to the first module 110 and can carry the first flow device 140a and the first filter 175a, respectively. Accordingly, the first electronic module 110 can carry the first flow device 140a, the first duct 130, the second duct 135, the first filter 175a, and can be easily movable from one location to another.

Figure 6:
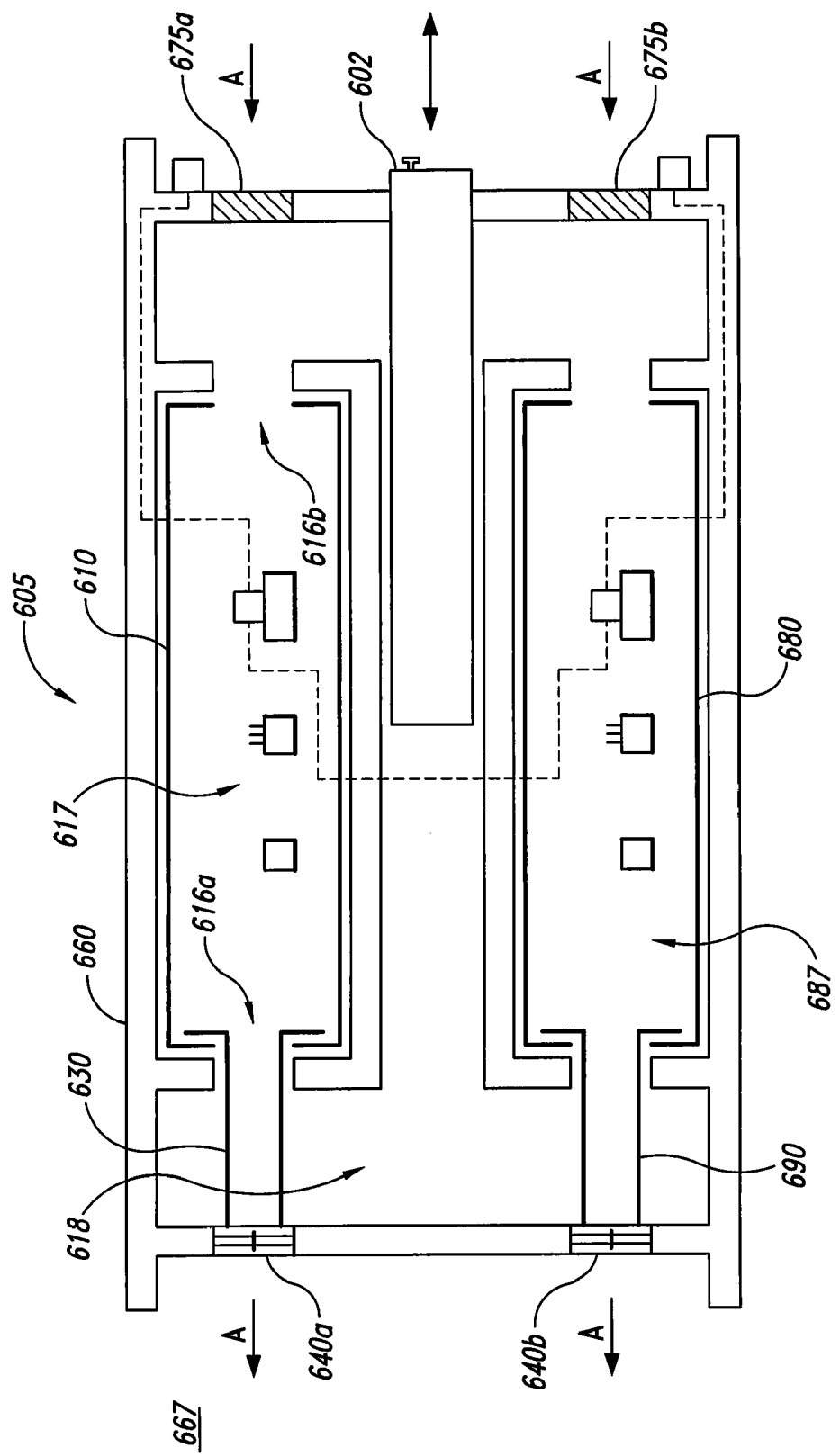
FIG. 6 is a partially schematic cross-sectional side elevation view of an electronic system in accordance with other embodiments of the invention.

FIG. 6 is a partially schematic cross-sectional side elevation of an electronic system 605 in accordance with still other embodiments of the invention. In FIG. 6, the electronic system includes a support structure 660 that is integral with an enclosure and carries one or more electronic modules. For example, in FIG. 6 the support structure 660 fully encloses a first electronic module 610 and a second electronic module 680, similar to the manner in which the enclosure 165 enclosed the first and second modules 110 and 180 in FIG. 5. In other embodiments, the support structure 660 only encloses a portion of the first and second modules 610 and 680.

In the illustrated embodiment, the support structure 660 carries the first electronic module 610, the second electronic module 680, a first flow device 640a, a second flow device 640b, a first filter 675a, and a second filter 657b. In FIG. 6, a first duct 630 is coupled or connected to the support structure 660 and operably coupled to the first flow device 640a. The first duct 630 extends between the first flow device 640a and the first module 610 and extends through an air outlet opening 616a so that a portion of the first duct 630 is located exterior to the first module 610 and another portion is positioned interior to the first module 610. The first flow device 640a is positioned and configured to produce a pressure differential between an interior 617 of the first module 610 and an exterior 618 of the first module 610, which is also an interior of the support structure 660. This pressure differential causes air A to flow from the exterior 667 of the support through the first and second filters 675a and 675b into the interior of the support structure 660, through the first module 610, through the first duct 630, through the first flow device 640a, and to the exterior 667 of the support structure 660. This feature carries heat away from the first module 610.

In the illustrated embodiment, the second duct 690 is coupled or connected to the support structure 660 and operably coupled to the second flow device 640b. The second duct 690 extends between the second flow device 640b and the second module 680, in a similar manner as the first duct 630 extends between the first flow device 640a and the first module 610. The second flow device 640b is positioned and configured to produce a pressure differential between an interior 687 of the second module 680 and the interior of the support structure 660. This pressure differential causes air A to flow from the exterior 667 of the support through the first and second filters 675a and 675b into the interior of the support structure 660, through the second module 610, through the second duct 690, through the second flow device 640b, and to the exterior 667 of the support structure 660. This feature carries heat away from the second module 680. Additionally, as shown in FIG. 6, air entering through the first and second filters 675a and 675b can mix before entering the first or second modules 610 and 680. In selected embodiments, this feature can carry additional residual heat away the interior of the support structure 660 or the balance of otherwise static air in the case can be evacuated to passively remove heat from other heat emitting devices.

In the illustrated embodiment, the integral enclosure and support structure 660 provides protection for the first and second modules 610 and 680, and is easily movable from one location to another. Additionally, the support structure 660 can carry other items. For example, in the illustrated embodiment the support structure 660 also carries a utility drawer 602 that can be used to store items associated with the electronic system 605 (e.g., power cords or other connecting wires). In other embodiments, one or more of the ducts can be integral with the support structure 660.

Figure 7:
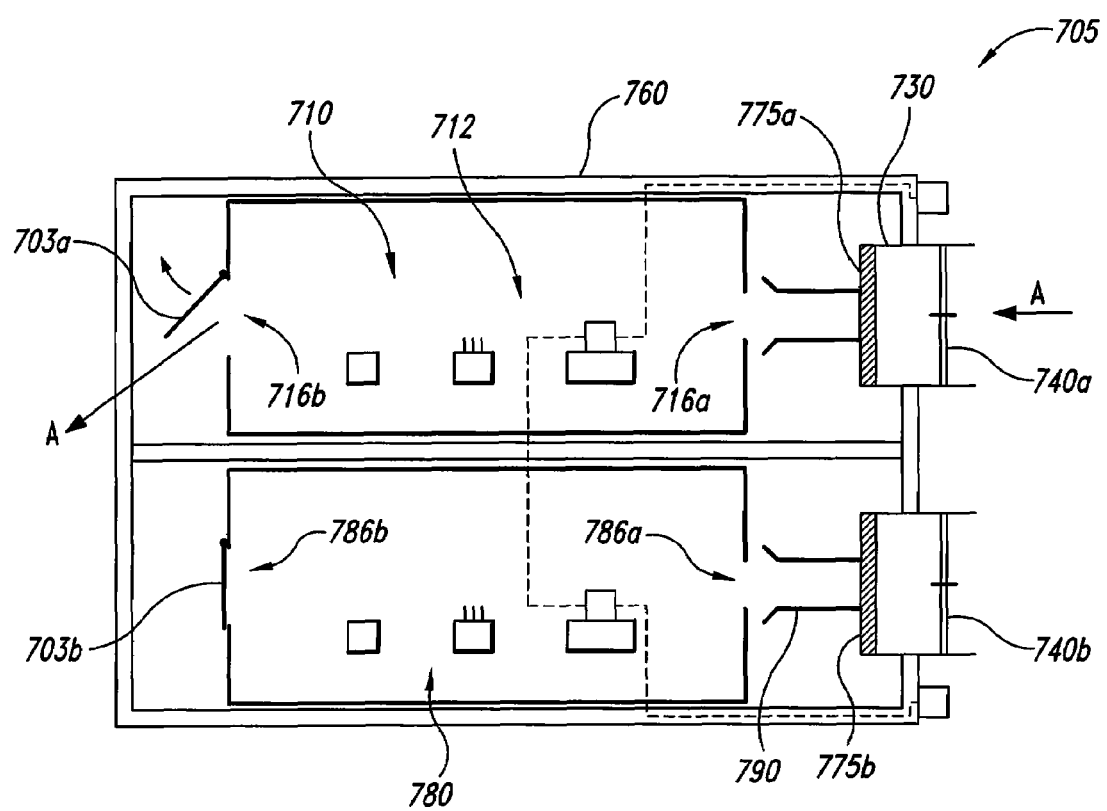
FIG. 7 is a partially schematic cross-sectional side elevation view of an electronic system in accordance with still other embodiments of the invention.

FIG. 7 is a partially schematic cross-sectional side elevation of an electronic system 705 in accordance with yet other embodiments of the invention. In FIG. 7, the electronic system 705 includes a support 760 that carries a first electronic module 710, a second electronic module 780, a first duct 730 and a second duct 790. The first duct carries a first filter 775a and a first flow device 740a. The second duct 790 carries a second filter 775b and a second flow device 740b. A portion of the first duct 730 is positioned proximate to a first opening 716a in the first module 710 and the second duct 790 is positioned proximate to a first opening 786a in the second module 780.

Although the first and second ducts 730 and 790 do not touch the first and second modules 710 and 780, the first and second ducts 730 and 790 are positioned to be in fluid communication with the air inlet openings 716a and 786a of the first and second modules 710 and 780, respectively (e.g., at least a portion of air exiting the ducts will enter the respective opening). Accordingly, the first and second flow devices 740a and 740b are positioned and configured to produce a pressure differential between the interior and exterior of the first and second modules 710 and 790, respectively. For example, the first flow device 740a can cause air to flow through the first duct 730, through the filter located in the first duct, through the air inlet opening 716a in the first module 710, through an interior of the first module 710, and through an air outlet opening 716b, thereby cooling electronic components 712 located in the interior of the first module 710. As the air exits the air outlet opening 716b, the air can push open a first flapper valve 703a. When the air flow stops, the flapper valve can substantially cover the air outlet opening 716b. In FIG. 7, there is no air flow through the second module 780 and a second flapper valve 703b is shown covering a second opening 786b of the second module 780.

In the illustrated embodiment, the support 760 carries the first and second modules 710 and 780 and is easily movable from one location to another. In other embodiments panels can be connected to the support 760 to enclose at least a portion of the first and second modules 710 and 780. If the first and second modules 710 and 780 are enclosed, a portion of air flow exiting the first duct 730, but not entering the first module 710, can create airflow through the enclosure formed by the panels, thereby removing residual heat, as discussed above with reference to FIG. 6.

Figure 8:
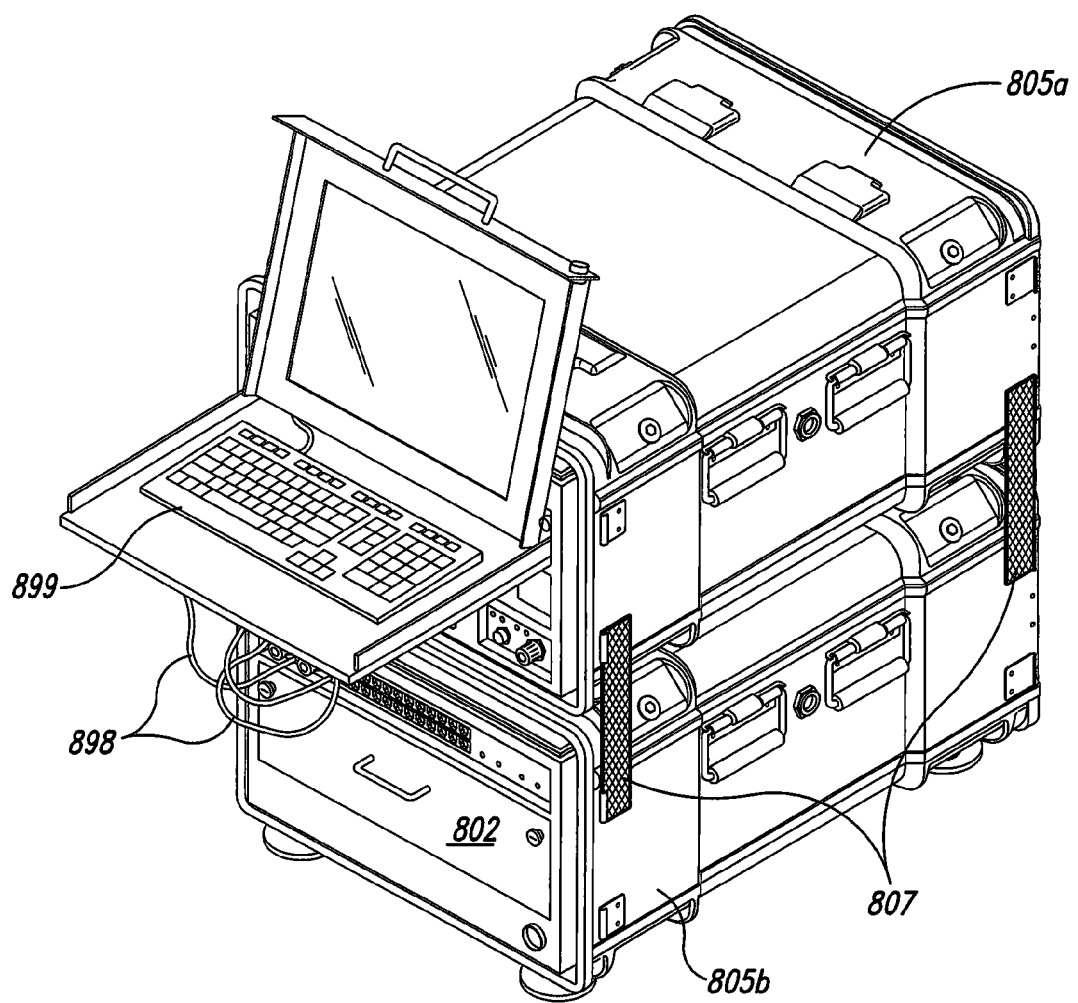
FIG. 8 is a partially schematic illustration of multiple electronic systems operably coupled together in accordance with yet other embodiments of the invention.

FIG. 8 is a partially schematic illustration of multiple electronic systems operably and physically coupled together in accordance with yet other embodiments of the invention. In FIG. 8, a first electronic system 805a is stacked on a second electronic system 805b. The first and second electronic systems 805a and 805b are similar to the electronic system 105 discussed above with reference to FIG. 5. However, the first electronic system 805a has an interface 899 that includes a keyboard that has an extended and stowed position. Additionally, the second electronic system 805b has a drawer 802, similar to the drawer 602 discussed above with reference to FIG. 6. The first and second electronic systems are operably coupled together via signal paths 898 (e.g., wires) and physically coupled together by coupling device(s) 807. In the illustrated embodiment, one or more coupling devices 807 can be used to couple two or more electronic systems together and can include latches, straps, bolts, fasteners, and the like. In still other embodiments, one or more electronic systems can be operably coupled together using other methods, including wireless connection technology.

Features and advantages of embodiments discussed above with reference to FIG. 6-8 are similar to those discussed above with reference to FIGS. 1-5.

From the foregoing, it will be appreciated that specific embodiments of the invention have been described herein for purposes of illustration, but that various modifications may be made without deviating from the invention. For example, aspects of the invention described in the context of particular embodiments may be combined or eliminated in other embodiments. Furthermore, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. An electronic system, comprising:

a support;

an electronic module having a housing, multiple heat producing electronic components in the housing and an internal cooling system in the housing that enables air to move in the housing at up to a first velocity relative to the electronic components, the electronic components having individual maximum core operating temperature limits within the housing, the housing having an air inlet opening and an air outlet opening that allow air to flow between an interior and an exterior of the housing, the electronic module being configured to operate in a mode below a manufacturer's maximum rated external ambient air operating temperature without the electronic components exceeding their individual maximum core operating temperature limits;

the support coupled to the housing and comprising a first duct and a second duct, at least a portion of the support being exterior of the housing and in fluid communication with at least one of the air inlet opening or the air outlet opening; and a flow device located exterior to the housing and coupled to the support such that at least a portion of the air entering the interior of the housing passes through the second duct, the flow device being positioned and configured to produce a pressure differential between the interior of the housing and the exterior of the housing to cause air to flow through the housing at a second velocity greater than the first velocity such that the electronic module can be operated in the selected mode at an external ambient air temperature greater than the manufacturer's maximum rated external ambient air operating temperature without the multiple electronic components exceeding their corresponding maximum core operating temperature limits; and an enclosure, the flow device being carried by the enclosure, the first duct extending between the flow device and the electronic module and being configured so that at least a portion of air passing through the flow device passes through the first duct, the enclosure carrying a filter, the second duct extending between the electronic module and the filter and being configured so that at least a portion of air passing through the filter flows through the second duct.

2. The system of claim 1 wherein the electronic module includes a portion of a computing system.

3. The system of claim 1 wherein at least one of the first or second ducts carries the flow device.

4. The system of claim 1 wherein the flow device is positioned and configured to produce a pressure differential between the interior of the housing and the exterior of the housing to suck air through the housing of the electronic module.

5. The system of claim 1, further comprising:
a temperature sensor proximate to the housing and configured to sense a local temperature of the air flow proximate to the housing; and
a controller operatively coupled to the flow device and the temperature sensor, the controller configured to control the pressure differential created by the flow device in response to the local temperature of the airflow.

6. The system of claim 1, further comprising:
a temperature sensor proximate to the housing configured to sense an exhaust temperature of air exiting the housing when the flow device produces a pressure differential; and
a controller operatively coupled to the flow device and the temperature sensor, the controller configured to control the pressure differential created by the flow device in response to the exhaust temperature.

7. A mobile communications system, comprising:
a support:
an electronic module carried by the support, the electronic module having a housing and multiple electronic components carried in the housing, the housing having a first opening and a second opening configured to allow air to flow between an interior of the housing and an exterior of the housing to facilitate cooling of the electric components;
the support comprises at least a portion of the first duct being exterior to the housing and in fluid communication with the first opening;
a high velocity air flow device coupled to the first duct, the flow device located exterior to the housing, the flow device being positioned and configured to produce a pressure differential between the interior of the housing and the exterior of the housing to cause air to flow through the housing, the mobile electronic system being configured to be transportable as a unit from one location to another;

the support further comprises at least a portion of the second duct being exterior to the housing and in fluid communication with the second opening so that when the flow device produces the pressure differential, at least a portion of air entering the interior of the housing passes through the second duct; and an enclosure, the support being carried in the enclosure or the support being integral with the enclosure, the flow device being carried by the enclosure, the first duct extending between the flow device and the electronic module and being configured so that at least a portion of air passing through the flow device passes through the first duct, the enclosure carrying a filter, the second duct extending between the electronic module and the filter and being configured so that at least a portion of air passing through the filter flows through the second duct.

8. The system of claim 7 wherein the first and second ducts and the flow device are carried by the support.

9. The system of claim 7 wherein the system includes a first mobile electronic system configured to be either operatively coupled or physically coupled to at least one second mobile electronic system, or both operatively and physically coupled to the at least one second mobile electronic system.

10. The system of claim 7 wherein:
the electronic module is configured to operate in a mode below a maximum manufacturer's rated first ambient air temperature without the multiple electronic components exceeding their individual corresponding maximum operating temperature limits; and
the flow device is configured to produce a pressure differential to cause air to flow through the housing such that the electronic module can be operated in the selected mode at a second ambient air temperature greater than the maximum manufacturer's rated first ambient air temperature without the multiple electronic components exceeding their corresponding maximum operating temperature limits.

11. The system of claim 7 wherein the electronic module includes a first electronic module with a first housing and multiple first electronic components, the duct includes a first duct, and the high-velocity flow device includes a first high-velocity flow device, and where in the system further comprises:
a second electronic module carried by the support, the second electronic module having a second housing and multiple second electronic components carried in the second housing, the second housing having the at least two openings configured to allow air to flow between an interior of the second housing and an exterior of the second housing to facilitate cooling of the second electronic components, wherein the second duct is in fluid communication with at least one of the openings of the second housing;
a second high-velocity flow device coupled to the second duct, the second high-velocity flow device being configured to produce a pressure differential between the interior of the second housing and the exterior of the second housing to cause high velocity air to flow through the second housing.

12. A mobile communications system, comprising:
a support;

a first electronic module carried by the support, the first electronic module having a housing and multiple first electronic components carried in the housing, the housing having a first opening and a second opening configured to allow air to flow between an interior of the housing and an exterior of the housing to facilitate cooling of the first electronic components;

a first duct, at least a portion of the first duct being exterior to the housing an in fluid communication with at least one of the first or second openings;

a first high velocity air flow device coupled to the first duct, the first flow device located exterior to the housing, the flow device being positioned and configured to produce a pressure differential between the interior of the housing and the exterior of the housing to cause air to flow through the housing, the mobile electronic system being configured to be transportable as a unit from one location to another;

an enclosure, the support being carried in the enclosure or the support being integral with the enclosure, the first flow device being carried by the enclosure, the first duct extending between the first flow device and the first opening of the first electronic module and being configured so that at least a portion of air passing through the first flow device flows between the interior of the first housing and an exterior of the enclosure;

a first filter carried by the enclosure;

a second duct extending between the second opening of the first electronic module and the first filter and being configured so that at least a portion of air passing through the first filter passes between the interior of the first housing and an the exterior of the enclosure;

a second electronic module carried by the support, the second electronic module having a second housing and multiple second electronic components carried in the second housing, the second housing having a third opening and a fourth opening, the third and fourth openings being configured to allow air to flow between an interior of the second housing and an exterior of the second housing to facilitate cooling of the second electronic components;

a second flow device carried by the support, the second flow device being configured to produce a pressure differential between the interior of the second housing and the exterior of the second housing to cause air to flow through the second housing;

a third duct extending between the second flow device and the third opening of the second electronic module and being configured so that at least a portion of air passing through the second flow device flows between the interior of the second housing and an exterior of the enclosure;

a second filter carried by the enclosure; and a fourth duct extending between the fourth opening of the second electronic module and the second filter and being configured so that at least a portion of air passing through the second filter passes between the interior of the second housing and an the exterior of the enclosure, and wherein the first and second electronic modules are configured to operate together to provide network switching equipment.

13. An electronic system, comprising: a support
an electronic module having a housing, multiple electronic components in the housing, and an internal cooling system in the housing that enables air to move in the housing at up to a first velocity relative to the electronic components, the electronic components having individual maximum core operating temperature limits within the housing, the housing having at a first opening and a second opening configured to allow air to flow between an interior of the housing and an exterior of the housing to facilitate cooling of the electronic components, the electronic module being configured to operate in a mode at or below a manufacturer's maximum rated external ambient air operating temperature without the multiple electronic components exceeding their individual corresponding maximum core operating temperature limits;

the support comprises at least a portion of the first duct being exterior to the housing and in fluid communication with the first opening;

the support further comprises at least a portion of the second duct being exterior to the housing and in fluid communication with the second opening;

an air moving mechanism for producing a pressure differential between the interior of the housing and the exterior of the housing to cause air to flow through the housing at a second velocity greater than the first velocity such that the electronic module can be operated in the mode at an external ambient air temperature greater than the manufacturer's maximum rated external ambient air operating temperature without the multiple electronic components exceeding their individual maximum core operating temperature limits, the air moving mechanism being located exterior to the housing; and an enclosure, the air moving mechanism being carried by the enclosure, the first duct extending between the air moving mechanism and the electronic module and being configured so that at least a portion of air passing through the flow device passes through the first duct, the enclosure carrying a filter, the second duct extending between the electronic module and the filter and being configured so that at least a portion of air passing through the filter flows through the second duct.

14. The system of claim 13 wherein the electronic module includes a portion of a computing system.

15. The system of claim 13 wherein the air moving mechanism is positioned and configured to draw a flow of air through the interior of the housing at the second velocity.

16. The system of claim 13 wherein the filter is positioned so that at least a portion of air passes through the filter before entering the interior of the housing.

17. The system of claim 13, further comprising:
a temperature sensor proximate to the housing and configured to sense a local temperature; and
a processing means for controlling air moving mechanism in response to the local temperature.

18. An electronic system, a support:
an electronic module having a housing, multiple heat producing electronic components in the housing and an internal cooling system in the housing configured to move air in the housing at up to a maximum first velocity relative to the electronic components, the housing having a first air inlet and outlet opening and a second air inlet that allow air to flow between an interior and an exterior of the housing;

the support comprises coupled to the housing, at least a portion of the first air duct being exterior of the housing and in direct communication with at least one of the air inlet or outlet openings;

a high-velocity flow device located exterior to the housing and coupled to the first air duct, the flow device being positioned and configured to create an airflow drawn through the first air duct and directly through the housing at a second velocity greater than the first velocity;

the support further comprises at least a portion of the second air duct being exterior to the housing and in fluid communication with at least one of the air inlet or outlet openings so that when the flow device produces the pressure differential, at least a portion of air entering the interior of the housing passes through the second air duct; and an enclosure, the high-velocity flow device being carried by the enclosure, the first air duct extending between the flow device and the electronic module and being configured so that at least a portion of air passing through the high-velocity flow device passes through the first air duct, the enclosure carrying a filter, the second air duct extending between the electronic module and the filter and being configured so that at least a portion of air passing through the filter flows through the second air duct.

* * * * *

UNITED STATES PATENT AND TRADEMARK OFFICE
CERTIFICATE OF CORRECTION

PATENT NO. : 7,573,713 B2 Page 1 of 1
APPLICATION NO. : 11/435355
DATED : August 11, 2009
INVENTOR(S) : Christopher J. Hoffman et al.

It is certified that error appears in the above-identified patent and that said Letters Patent is hereby corrected as shown below:

In column 6, line 7, after "as" delete "a".

In column 13, line 54 in claim 7, delete "support:" and insert -- support; --, therefor.

In column 13, line 62 in claim 7, delete "at" and insert -- a first duct, at --, therefor.

In column 14, line 6 in claim 7, delete "at" and insert -- a second duct, at --, therefor.

In column 15, line 9 in claim 12, delete "an" and insert -- and --, therefor.

In column 15, line 62 in claim 13, delete "support" and insert -- support; --, therefor.

In column 16, line 12 in claim 13, delete "at" and insert -- a first duct, at --, therefor.

In column 16, line 15 in claim 13, delete "at" and insert -- a second duct, at --, therefor.

In column 16, line 52 in claim 18, delete "support:" and insert -- support; --, therefor.

In column 16, line 61 in claim 18, delete "comprises" and insert -- comprises a first air duct --, therefor.

In column 17, line 3 in claim 18, delete "at" and insert -- a second air duct, at --, therefor.

Signed and Sealed this

Eighteenth Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,573,713 B2  Page 1 of 1
APPLICATION NO. : 11/435355
DATED : August 11, 2009
INVENTOR(S) : Hoffman et al.

It is certified that error appears in the above-identified patent and that said Letters Patent is hereby corrected as shown below:

Title Page, Item [*]

Delete the phrase "by 471 days" and insert -- by 558 days --.

Signed and Sealed this

Twenty-fourth Day of August, 2010

David J. Kappos
*Director of the United States Patent and Trademark Office*

UNITED STATES PATENT AND TRADEMARK OFFICE
CERTIFICATE OF CORRECTION

PATENT NO. : 7,573,713 B2 Page 1 of 1
APPLICATION NO. : 11/435355
DATED : August 11, 2009
INVENTOR(S) : Hoffman et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 558 days.

Signed and Sealed this

Seventh Day of September, 2010

David J. Kappos
*Director of the United States Patent and Trademark Office*